United States Patent
Pal et al.

(10) Patent No.: US 8,593,808 B2
(45) Date of Patent: Nov. 26, 2013

(54) INTEGRATED FAN MOTOR AND CONTROLLER HOUSING

(75) Inventors: Debabrata Pal, Hoffman Estates, IL (US); Mark W. Metzler, Davis, IL (US); Terry J. Milroy, Loves Park, IL (US); Randy P. Gauvin, Beloit, WI (US)

(73) Assignee: Hamilton Sundstrand Corporation, Windson Locks, CT (US)

( * ) Notice: Subject to any disclaimer, the term of this patent is extended or adjusted under 35 U.S.C. 154(b) by 253 days.

(21) Appl. No.: 13/233,855

(22) Filed: Sep. 15, 2011

(65) Prior Publication Data

US 2012/0236498 A1    Sep. 20, 2012

Related U.S. Application Data

(63) Continuation-in-part of application No. 13/050,509, filed on Mar. 17, 2011, now Pat. No. 8,368,497.

(51) Int. Cl.
*H05K 7/20* (2006.01)

(52) U.S. Cl.
USPC ............. 361/695; 361/679.47; 361/679.49; 361/679.5; 361/679.51; 361/697; 165/80.3; 165/104.33; 165/121; 165/123; 454/184

(58) Field of Classification Search
USPC ........... 361/679.46–679.54, 690–697, 715, 361/721–728; 165/80.2, 80.3, 104.33, 165/121–127, 185; 454/184; 336/54–60
See application file for complete search history.

(56) References Cited

U.S. PATENT DOCUMENTS

| | | | | |
|---|---|---|---|---|
| 6,933,638 | B2 * | 8/2005 | Hirth | 310/71 |
| 7,295,434 | B2 * | 11/2007 | Foulonneau | 361/695 |
| 7,719,836 | B2 * | 5/2010 | Franz et al. | 361/695 |
| 7,877,832 | B2 * | 2/2011 | Reinbold | 15/22.1 |
| 2002/0109426 | A1 * | 8/2002 | Peter et al. | 310/89 |
| 2009/0267432 | A1 * | 10/2009 | Henry et al. | 310/71 |

FOREIGN PATENT DOCUMENTS

FR    2772844 A1 *  6/1999
JP    06021677 A  *  1/1994

* cited by examiner

*Primary Examiner* — Michail V Datskovskiy
(74) *Attorney, Agent, or Firm* — Kinney & Lange, P.A.

(57) ABSTRACT

An electronics cooling system comprises a tubular fan duct and an electronics housing. The fan duct includes has a fan duct casing containing a fan with rotor blades and stator vanes. The electronics housing is mounted directly on the tubular fan duct, such that the electronics housing and the fan duct casing together enclose an interior space. A cooling airflow path extends from a high-pressure region of the tubular fan duct, through an inlet hole into the interior space, and out a bleed hole into a surrounding environment. The electronics cooling system further comprises three electronics mounts within the interior space. A first electronics mount is located immediately adjacent to the inlet hole, on the fan duct. A second electronics mount is located immediately radially outward of the stator vanes, on the fan duct. A third electronics mount is located immediately adjacent to the bleed hole, on the housing.

20 Claims, 7 Drawing Sheets

INTEGRATED FAN MOTOR AND CONTROLLER HOUSING

CROSS-REFERENCE TO RELATED APPLICATION

This application is a continuation in part of Pal et al. U.S. patent application Ser. No. 13/050,509, filed Mar. 17, 2011, which is hereby incorporated by reference. Pal et al. U.S. patent application Ser. No. 13/052,837, filed Mar. 21, 2011, is also incorporated by reference.

BACKGROUND

The present invention relates generally to electronics cooling, and more particularly to air cooling for a fan motor controller.

Fans are commonly used to dissipate heat from electronic components, thereby avoiding component failure and extending component lifetimes. Some electronic components in aircraft, including motor controllers, are commonly located in motor controller housings mounted on fan housings. Electronics installed in these motor controller housings are conventionally cooled with airflow circulated by the nearby fan. Some such cooling systems divert relatively cool air from a region of the fan duct downstream of the fan, and pass this air through the housing before releasing it into the environment at a vent in the housing. Other conventional cooling systems take in air from the environment for cooling by means of an outlet in the casing, and draw this air through the housing by means of an air passage from the housing to a region of the fan duct immediately upstream of the fan. In aircraft, the fan which provides cooling airflow may be a part of an air management system. The amount of air utilized for cooling is typically small compared to the total airflow volume of the fan—usually on the order of 2%—and thus does not disrupt normal fan functions, such as cabin or lavatory air circulation or for electronics bay cooling.

Conventional fan motor controller assemblies comprise a box-like fan motor controller housing with a flat base mounted to an adjacent cylindrical fan duct via an intervening thermal interface which adds to the cost and weight of the total assembly. In addition, many fan motor controller housings include machined fins arranged near high-heat components to increase heat dissipation surface area. These fins also increase the cost and weight of the total assembly.

It is generally desirable that the spatial footprint of fan motor controller hardware be as small as possible. Any increase to the packing density of heat generating electronics, however, necessitates corresponding improvements to heat dissipation, to avoid excessive component degradation. There exists, therefore, a need for fan motor controller housings capable of increased cooling at lower cost and weight.

SUMMARY

The present invention is directed toward an electronics cooling system comprising a tubular fan duct and an electronics housing. The fan duct includes a fan duct casing containing a fan with rotor blades and stator vanes. The electronics housing is mounted directly on the tubular fan duct, such that the electronics housing and the fan duct casing together enclose an interior space. A cooling airflow path extends from a high-pressure region of the tubular fan duct, through an inlet hole into the interior space, and out a bleed hole into a surrounding environment. The electronics cooling system further comprises three electronics mounts within the interior space. A first electronics mount is located immediately adjacent to the inlet hole, on the fan duct. A second electronics mount is located immediately radially outward of the stator vanes, on the fan duct. A third electronics mount is located immediately adjacent to the bleed hole, on the housing.

DETAILED DESCRIPTION

Figure 1:
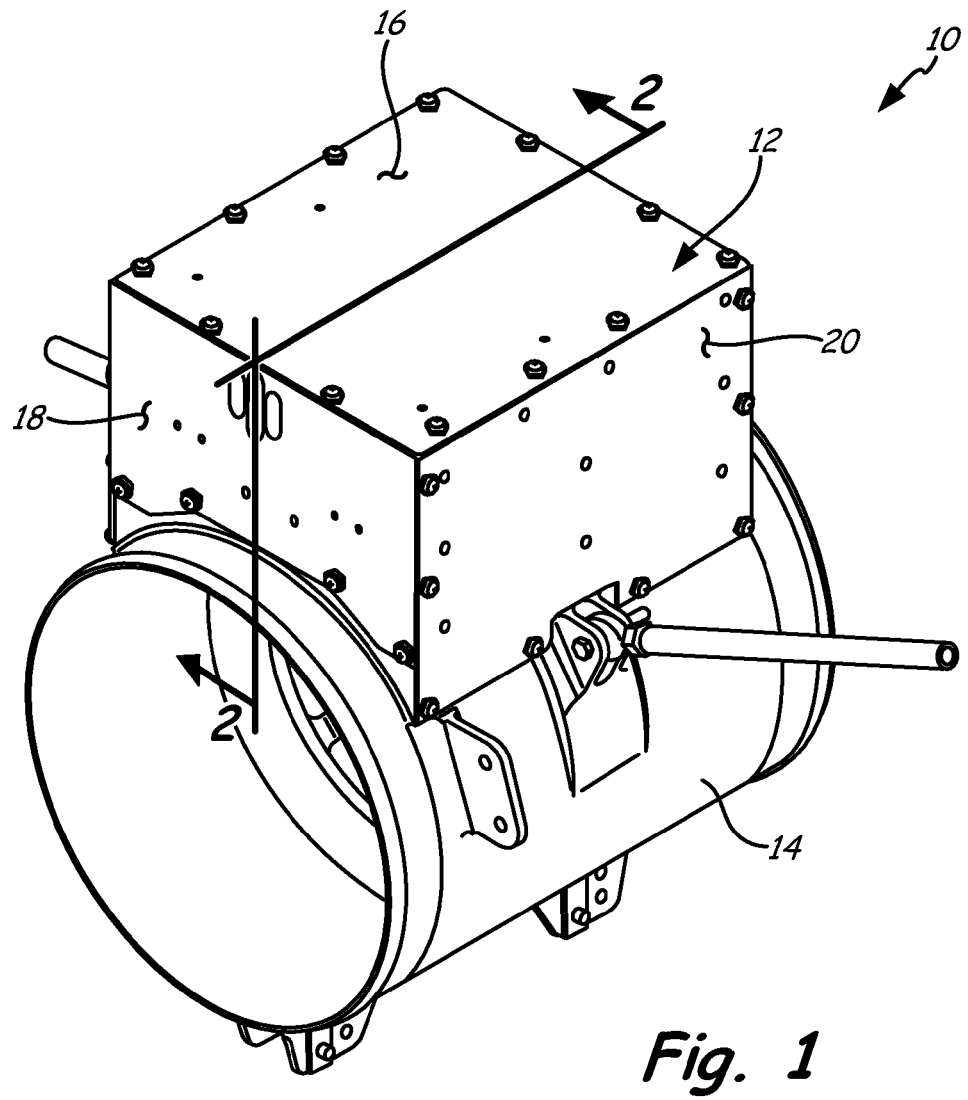
FIG. 1 is a perspective view of a fan motor controller assembly.

FIG. 1 is a perspective view of fan motor controller assembly 10. Fan motor controller assembly 10 comprises housing 12 and fan duct 14. Housing 12 is a boxlike structure containing motor controller electronic components which generate heat. Housing 12 is formed of a rigid, thermally conductive material, such as aluminum. Fan duct 14 is a substantially cylindrical duct containing a fan (see FIG. 2) which forces air in an airflow direction, when active, thereby creating regions of high and low relative pressure within fan duct 14 (see FIG. 2, below). Fan duct 14 may, for example, be an aluminum duct for an aircraft air management system, such as a cabin or lavatory air duct or an electronics cooling air supply.

As depicted, housing 12 is a five-sided structure comprised of one top panel 16, two front/rear panels 18, and two side panels 20. Top panel 16 and side panels 20 are substantially rectangular, while front/rear panels 18 are shaped to conform to the cylindrical shape of the adjacent surface of fan duct 14. In the depicted embodiment, front/rear panels 18 are eight-sided panels. In other embodiments, front/rear panels 18 may have other shapes which conform to the surface of fan duct 14. In some embodiments, both front/rear panels 18 are identical, as are both side panels 20. In other embodiments, each panel may exhibit minor differences, such as in the location of cooling or attachment holes (discussed below). Like fan duct 14, panels 16, 18, and 20 are formed of a rigid thermal conductor such as aluminum or aluminum alloy. In some embodiments each panel 16, 18, or 20 is a separate piece. In other embodiments some subset of panels 16, 18, and 20 may be cast or welded together in one piece.

Housing 12 forms a closed interior space together with fan duct 14. Housing 12 may be bolted or welded to fan duct 14. In some embodiments, one or more of panels 16, 18, or 20 are removable, allowing access to electronic components inside housing 12. Fan duct 14, although substantially cylindrical, includes a flat side portion coinciding with the location of housing 12, as depicted and described below with respect to FIG. 3.

Figure 2:
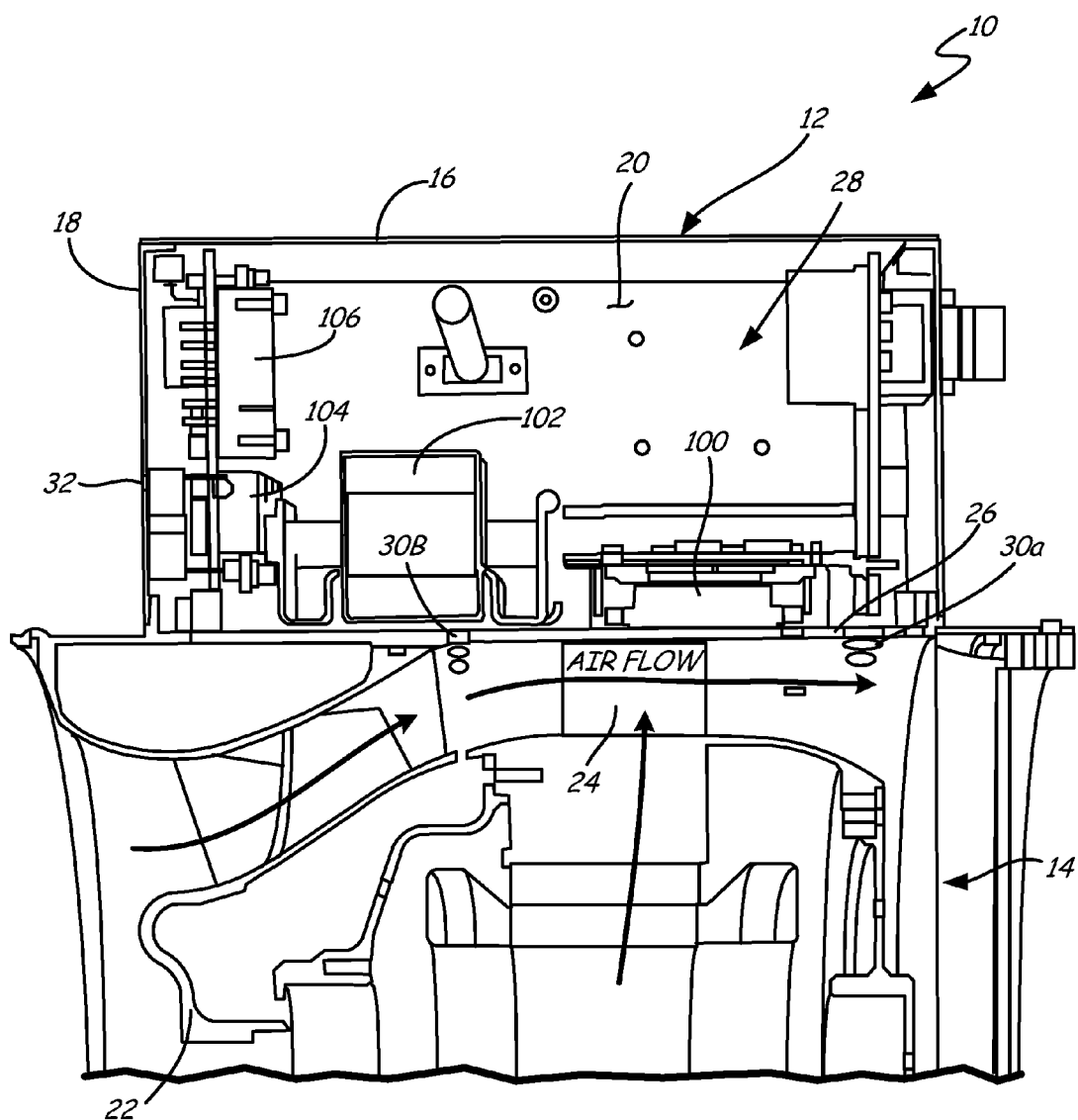
FIG. 2 is a cross-sectional view of the fan motor controller assembly of FIG. 1.

FIG. 2 is a cross-sectional view of motor controller assembly 10 through section line 2-2 of FIG. 1. Motor controller assembly 10 includes housing 12 and fan duct 14, as explained above. Fan duct 14 contains rotor blades 22 and stator vanes 24 situated within duct casing 26. Although only one stage of rotor blades 22 and stator vanes 24 is shown, some embodiments may include multiple stages of alternating rotor blades and stator vanes. Housing 12 has interior space 28 formed by duct casing 26 and panels 16, 18, and 20, as discussed above with respect to FIG. 1. The portion of duct casing 26 which bounds interior space 28 includes, in some embodiments, a substantially flat surface which deviates from the generally cylindrical shape of fan duct 14, as described and depicted below with respect to FIG. 3. Fan duct 14 is fluidly connected to the interior space 28 by inlet holes 30a and 30b (collectively referred to as inlet holes 30), and interior space 28 is fluidly connected to the environment by bleed holes 32. Inlet holes 30 are cast or drilled holes through the exterior of fan duct 14 at high-pressure locations. Air from inlet holes 30 is diverted out of fan duct 14 into interior space 28 to cool electronics. A plurality of bleed holes 32 are located on panels 18 and 20 to reject air from interior space 28. Bleed holes 32 are strategically located to draw air through electronic components, as described below with respect to FIGS. 4, 5A, 5B, and 6. Air diverted from fan duct 14 by inlet holes 30a and 30b enters and circulates throughout interior space 28, cooling electronic components therein before exiting through bleed holes 32. Air is expelled from bleed holes 32 to the surrounding environment (at low relative pressure). In some embodiments, bleed holes 32 may also be present in panel 16.

Housing 12 houses and provides cooling for various heat-producing electronic components, including insulated gate bipolar transistor (IGBT) module 100, auto-transformer rectifier unit (ATRU) 102, inter-phase transformers (IPTs) 104, and inductor 106. In many embodiments, additional electronic components such as printed wiring boards of various kinds are also situated in housing 12 for cooling. In addition, some electronic components are mounted on side panels 20, as described below with respect to FIGS. 4 and 6. As depicted, IGBT module 100 and ATRU 102 are mounted on duct casing 26, and are cooled by a combination of direct air cooling (convection) from air bled into interior space 28 by inlet holes 30, and indirect air cooling (conduction) through duct casing 26 into the primary air stream of fan duct 14. IPTs 104, inductor 106, and other components mounted on panels 16, 18, and 20 are cooled primarily through direct air cooling, as described below with respect to FIGS. 4, 5A, 5B, and 6.

IGBT module 100 is mounted directly on fan duct casing 26. IGBT module 100 is cooled convectively by direct air flow from inlet hole 30a, and conductively through fan duct casing 26 and stator vane 24 via indirect air cooling utilizing the primary air stream of fan duct 14. In the depicted embodiment there are six inlet holes 30a, each which Stator vanes 24 serve as cooling fins, providing increased surface area for heat dissipation into the air stream of fan duct 14.

Air diverted from fan duct 14 flows through and around ATRU 102, providing direct air cooling. In one embodiment, ATRU 102 may be a light-weight transformer supported by a support structure mounted on duct casing 26, as described in U.S. patent application Ser. No. 13/050,509, from which this application is a continuation in part. In other embodiments ATRU 102 may be a conventional transformer assembly in thermal potting. ATRU 102 includes air channels through which air from a high-pressure region of fan duct 14 can pass to cool ATRU 102. In some embodiments these air channels meet with inlet holes 30b, such that the pressure differential between interior space 28 (low relative pressure) and the high-pressure region of fan duct 14 (high relative pressure) draws cooling air through ATRU 102.

By mounting IGBT module 100 and ATRU 102 directly on fan duct casing 26, fan motor controller assembly 10 is able to provide adequate cooling to both components without relying on a heavy thermal interface between electronic components and fan duct 14. In addition, utilizing stator vanes 24 as cooling fins obviates the need for a separate finned heat exchanger, further reducing mass without decreasing cooling capacity.

Figure 3:
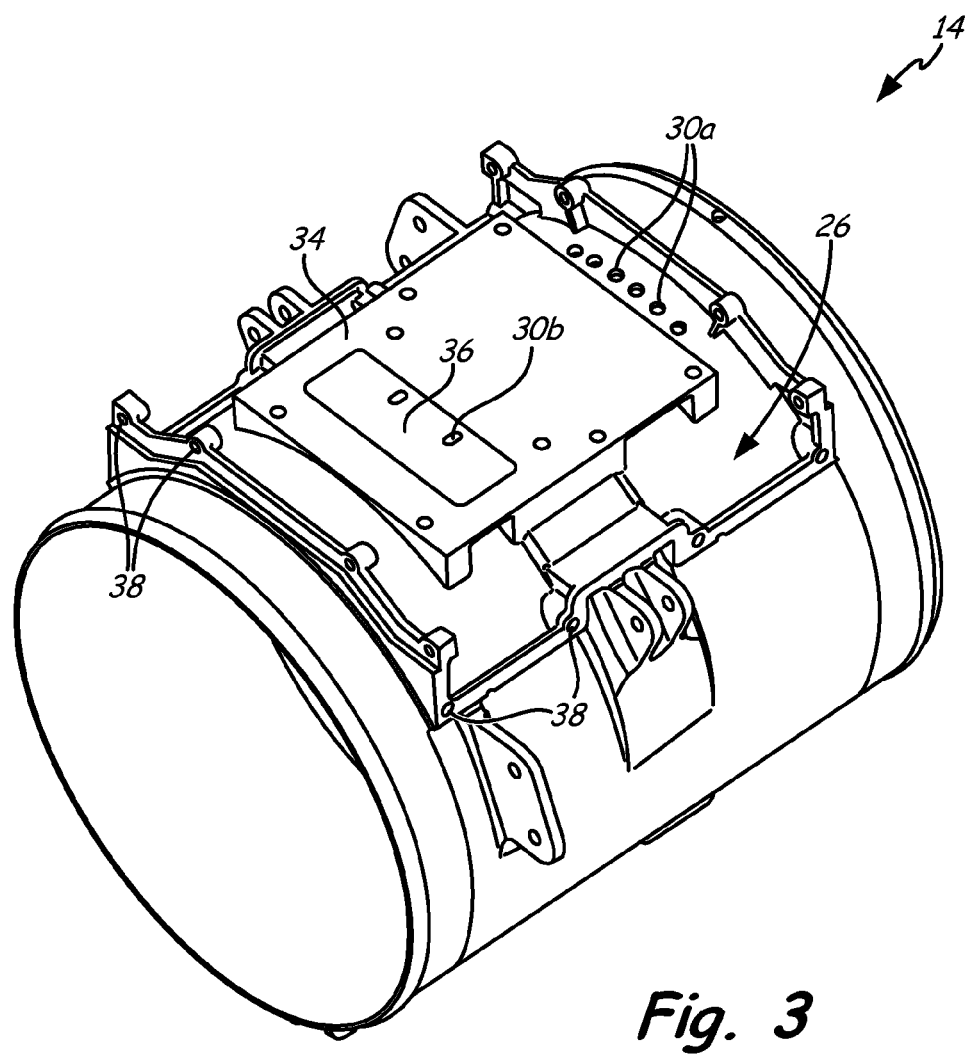
FIG. 3 is a perspective view of a fan duct of the fan motor controller assembly of FIG. 1.

FIG. 3 is a perspective view of fan duct 14, depicting fan duct casing 26 with inlet holes 30 (including inlet holes 30a and inlet holes 30b), flat pedestal 34, thermal interface 36, and attachment holes 38. As described above with respect to FIGS. 1 and 2, fan duct casing 26 forms the exterior of fan duct 14, and inlet holes 30 provide cooling airflow through interior space 28 (see FIG. 2). Attachment holes 38 are rivet or screw holes which allow front/rear panels 18 and side panels 20 to be bolted to fan duct casing 26. In some embodiments, some panels 18 or 20 may be removable by unscrewing bolts or screws from attachment holes 38. As mentioned previously, some panels 18 or 20 may be welded into place on fan duct casing 26.

Flat pedestal 34 provides a conductive platform for electronic components such as IGBT 100 and ATRU 102. By casting flat pedestal 34 into fan duct casing 26, fan motor controller assembly 10 is able to eschew the conventional separate flat electronics platform connected to a cylindrical surface of fan duct casing 26 by a heavy thermal interface. Flat pedestal 34 thus provides more direct conductive cooling of electronic components, while allowing the total mass of fan motor controller assembly 10 to be reduced. Some embodiments of fan motor controller assembly 10 further include one or more thermal interface layers 36, which may for instance be conventional thermal pads of a conductive material such as Thermstrate. Thermal interface layers 36 are thin and lightweight, and form a thermal interface between electronic components and fan duct casing 26 which does not significantly increase the mass of fan motor controller assembly 10.

Figure 4:
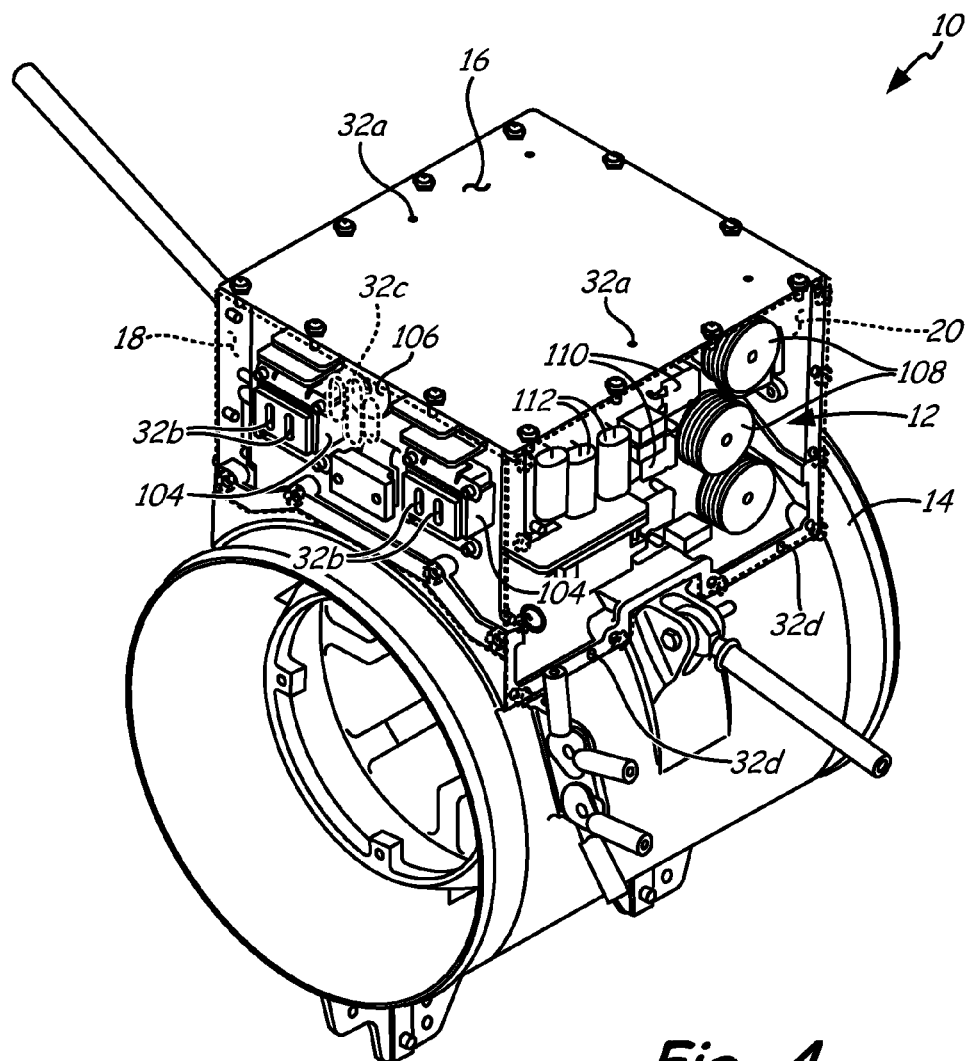
FIG. 4 is a transparent perspective view of the fan motor controller assembly of FIG. 1, depicting components within a fan motor controller housing.

FIG. 4 is a transparent perspective view of fan motor controller assembly 10, depicting components mounted in interior space 28 on panels 18 and 20, including IPTs 104, inductor 106, differential mode (DM) inductors 108, resistors 110, capacitors 112, and a plurality of printed wiring boards and other electronic components. Fan motor controller assembly 10 comprises housing 12 and fan duct 14 as described previously. Housing 12 is formed of top panel 16, two front/rear panels 18, and two side panels 20, and is penetrated by bleed holes 32 (including bleed holes 32a, 32b, 32c, and 32d). IPTs 104 and inductor 106 are mounted on one front/rear panel 18, while DM inductors 108, resistors 110, and capacitors 112 are mounted on one side panel 20. These components are cooled both by conductive dissipation through panels 18 or 20, and by direct air flow across or through the electronic components. Some components, such as capacitors 112, need little or no cooling. Other components, such as IPTs 104 and inductor 106, must be able to dissipate large amounts of heat to minimize component degradation. Bleed holes 32 in panels 16, 18, and 20 expel air from interior space 28, thereby producing a continuous cooling air flow from fan duct 14, through interior space 28, and into the environment. In particular, bleed holes 32a expel air though top panel 16, bleed holes 32b and 32c expel air through front/rear panels 18 (see FIGS. 5A and 5B, below), and bleed holes 32d expel air through side panels 20 (see FIG. 6, below). Bleed holes 32b are located at the mounting positions of IPTs 104 to draw air through IPTs 104 for increased direct air cooling. Bleed holes 32c are located at the mounting position of inductor 106 to similarly draw air through inductor 106 for direct air cooling. Bleed holes 32d are located near fan duct 14, and provide airflow through side panels 20, but are not located at the mounting positions of DM inductors 108 or resistors 110, as these components require less cooling than IPTs 104 or inductors 106. In general, bleed holes 32 draw air through the electronic components which much dissipate the most heat, while other components mounted on panels 16, 18, and 20 are cooled only by general airflow within and through interior space 28. Bleed holes 32 are thus strategically located to provide airflow directly through components in need of the most cooling. In the depicted embodiment, bleed holes 32a, 32b, and 32d and inlet holes 30a are circular holes 0.2 in. (5.1 mm) in diameter, bleed holes 32c are circular holes 0.125 in. (3.2 mm) in diameter, and inlet holes 30b are 0.312×0.188 in. (7.9×4.8 mm) kidney-shaped holes. Qualitatively, the sizes of inlet holes 30 are selected to provide adequate cooling airflow for motor controller electronics without impairing the operation of the fan by diverting excessive air. Inlet holes 30 only divert approximately 2% of airflow through fan duct 14, negligibly affecting the operation of the fan. Although the size of bleed holes 32 is not as critical, both inlet holes 30 and bleed holes 32 must be large enough to avoid clogging with dust or debris, yet small enough to concentrate airflow around heat-producing electronics. Bleed holes 32 secondarily provide means to expel moisture from fan motor controller assembly 10 during startup.

Figure 5A:
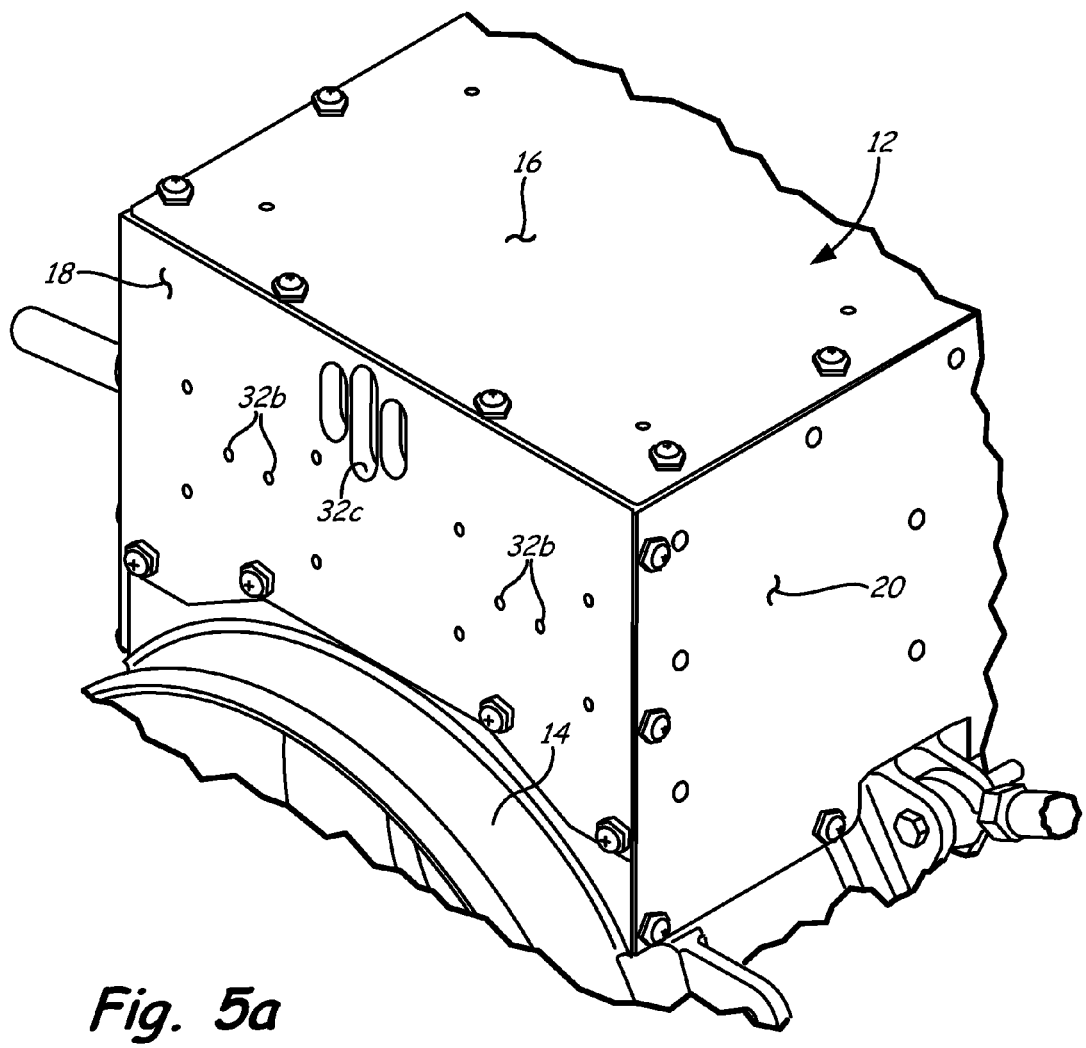
FIGS. 5A and 5B are perspective views of one panel of the fan motor controller housing of FIG. 4, from two angles.
Figure 5B:
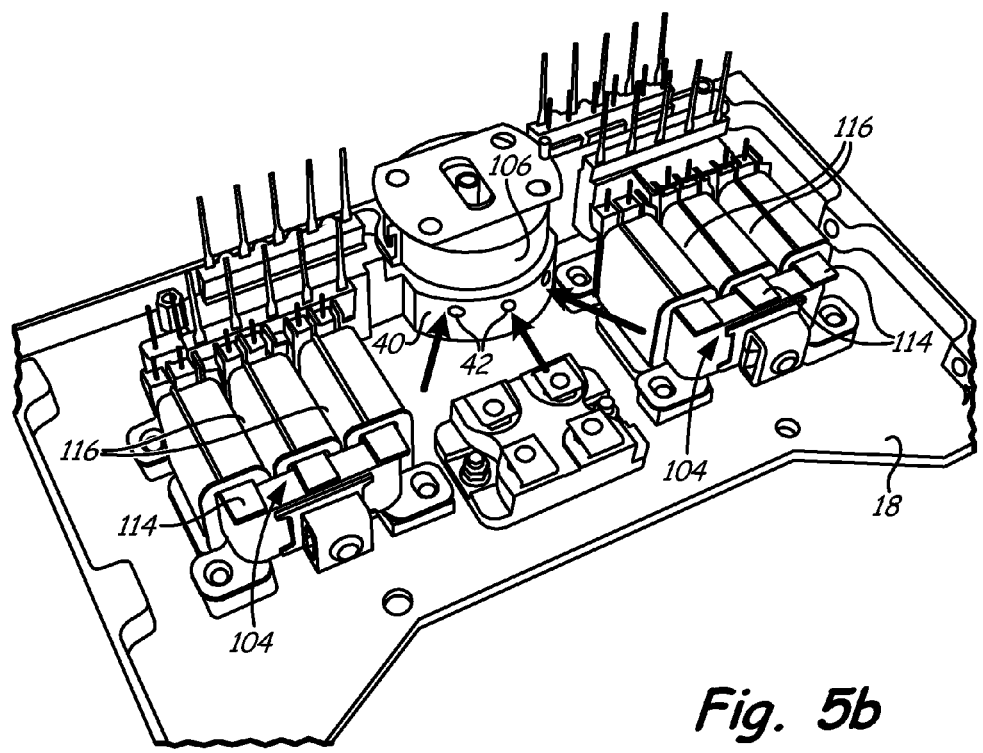

FIGS. 5A and 5B are perspective views of a one front/rear panel 18 of housing 12. FIG. 5A provides an exterior view of front/rear panel 18, while FIG. 5B shows the interior side of front/rear panel 20. Front/rear panel 18 has bleed holes 32b and 32c, and supports IPTs 104 and inductor 106.

Each IPT 104 comprises a plurality of wrapped cores 114 separated by spaces 116, which coincide with bleed holes 32b. Pressure differential between the environment (low relative pressure) and interior space 28 (high relative pressure) draws cooling air through spaces 116 and out via bleed holes 32b. This airflow directly through IPTs 104 provides increased cooling over convection cooling from general air circulation within interior space 28.

Front/rear panel 18 includes inductor mount 40, a platform to which inductor 106 is attached for cooling. Inductor mount 40 includes a plurality of inductor air passages 42 which extend from interior space 28 to bleed holes 32c. Air is drawn from interior space 28 through air passage 42 and out bleed holes 32c via the previously discussed pressure differential between the environment and interior space 28. The flow of cooling air through inductor air passages 42 provides increased cooling for inductor 106 over convection cooling from general air circulation within interior space 28.

The positioning of bleed holes 32b and 32c draws air through spaces 116 and inductor air passages 42, increasing possible heat dissipation from IPTs 104 and inductor 106 without significantly increasing the mass of fan motor controller assembly 10.

Figure 6:
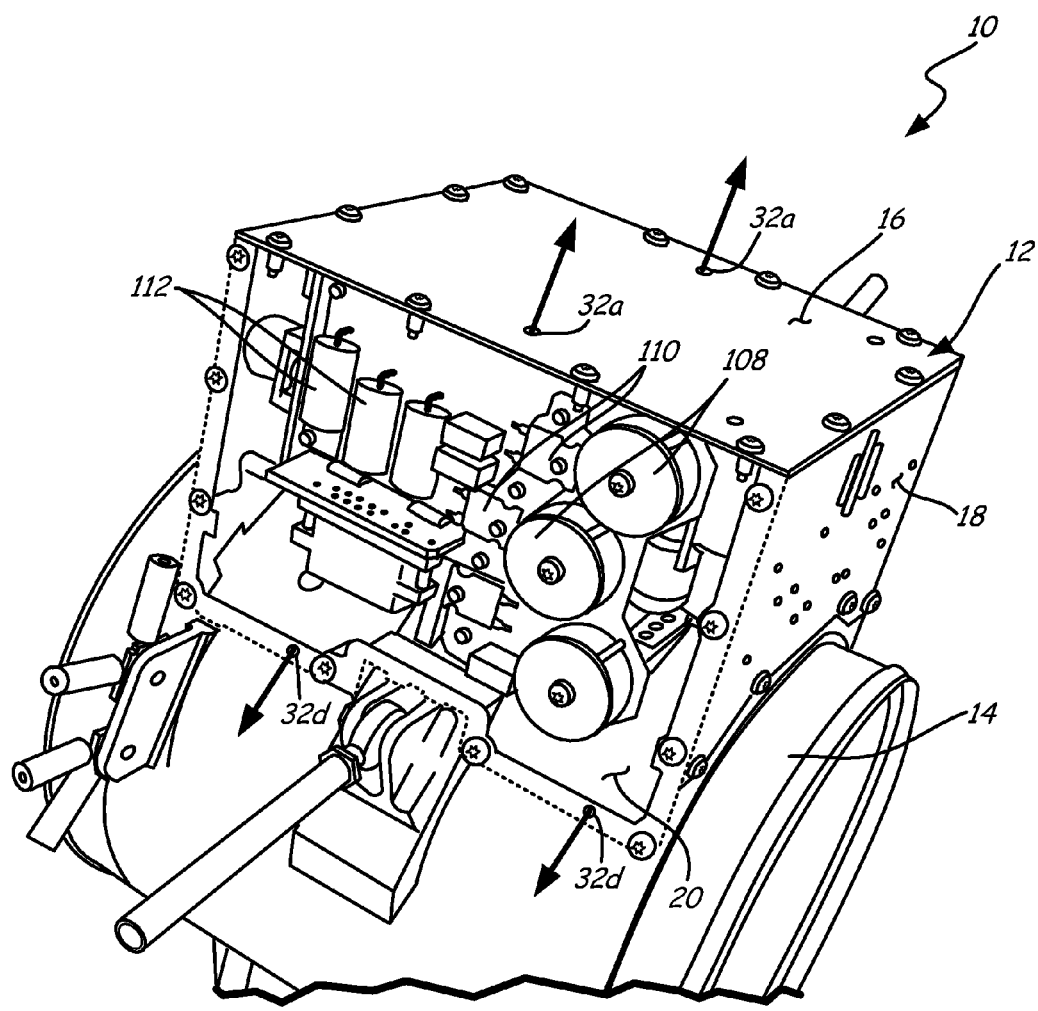
FIG. 6 is a transparent perspective view of another panel of the fan motor controller housing of FIG. 1.

FIG. 6 is a transparent perspective view of one side panel 20 of housing 12. Side panel 20 has bleed holes 32d, and supports DM inductors 108, resistors 110, and capacitors 112. Capacitors 112 produce negligible heat. DM inductors 108 and resistors 110 are substantial heat producers which must be cooled to avoid component damage and minimize deterioration. Unlike IPTs 104 or inductor 106, DM inductors 108 and resistors 110 are cooled only by circulated airflow within interior space 28; bleed holes 32d are located near the intersection of side panel 20 and fan duct casing 26, and therefore do not draw cooling air through DM inductors 108 or resistors 110. In alternative embodiments for which additional cooling is desired, electronic components and bleed holes 32d could be relocated to coincide, as described with respect to bleed holes 32b and 32c in FIGS. 5A and 5B. In the depicted embodiment, bleed holes 32a, 32b, 32c, and 32d collectively provide air circulation through interior space which directly cools heat-producing electronic components. air circulation through interior space Fan motor controller assembly 10 provides convection and conduction cooling for electronic components including IGBT module 100, ATRU 102, IPTs 104, inductor 106, DM inductors 108, and resistors 110. Hotter components are cooled by airflow directed through or adjacent to the components via inlet holes 30a and 30b, and bleed holes 30b and 30c. IGBT module 100 and ATRU 102, which produce the most heat of electronic components within fan motor controller assembly 10, are in direct thermal contact with fan duct casing 26 of fan duct 14, wherein stator vanes 24 act as cooling fins to dissipate heat over a large surface area. The location of components, inlet holes, and bleed holes in fan motor controller assembly 10 provides increased cooling over the prior art, while concentrating components in a smaller space, with reduced weight.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. An electronics cooling system comprises:
   a tubular fan duct with a fan duct casing containing a fan with rotor blades and stator vanes;
   an electronics housing mounted directly on the tubular fan duct, such that the electronics housing and the fan duct casing together enclose an interior space;
   a cooling airflow path from a high-pressure region of the tubular fan duct, through an inlet hole into the interior space, and out a bleed hole into a surrounding environment;
   a first electronics mount position on the fan duct, inside the interior space, and immediately adjacent to the inlet hole;
   a second electronics mount position on the fan duct, inside the interior space, and immediately radially outward from the stator vanes; and
   a third electronics mount position on the housing, inside the interior space, and immediately adjacent to the bleed hole.

2. The electronics cooling system of claim 1, wherein the inlet hole directs cooling airflow directly through electronics mounted at the first electronics mount position.

3. The electronics cooling system of claim 1, wherein the stator vanes serve as cooling fins, dissipating heat from electronics mounted at the second electronics mount position into a main airflow path of the fan.

4. The electronics cooling system of claim 1, wherein the bleed hole draws cooling air directly through electronics mounted at the third electronics mount position.

5. The electronics cooling system of claim 1, wherein the third electronics mount position is located on a platform through which the bleed hole passes, such that the bleed hole draws cooling air through the platform to cool electronics mounted at the third mount position.

6. A fan motor controller assembly comprises:
   a tubular fan duct with a fan duct casing containing a fan with rotor blades and stator vanes;

an electronics housing mounted directly on the tubular fan duct, such that the electronics housing and the fan duct casing together enclose an interior space;

a plurality of inlet holes through the tubular fan duct, fluidly connecting a high-pressure region of the tubular fan duct to the interior space;

a plurality of bleed holes through the electronics housing, fluidly connecting the interior space to the environment, thereby forming an airflow path from the tubular fan duct, through the inlet holes to the interior space, and out the bleed holes to a surrounding environment; and a plurality of electronic components disposed within the interior space, the plurality of electronic components comprising:

a first electronic component mounted on the tubular fan duct, and cooled conductively through the fan duct by utilizing the stator vanes as cooling fins to dissipate heat into a main airflow flow path of the fan; and a second electronic component mounted on the electronics housing at the location of at least one of the bleed holes, and cooled convectively via airflow through the bleed holes.

7. The fan motor controller assembly of claim 6, wherein the plurality of electronic components further comprises a third electronic component mounted on the tubular fan duct at the location of at least one of the inlet holes, and cooled convectively via airflow through the inlet holes.

8. The fan motor controller assembly of claim 7, wherein at least a portion of fan duct casing upon which the electronics housing is mounted forms a flat pedestal, and wherein the first electronic component and the third electronic component are mounted on the flat pedestal.

9. The fan motor controller assembly of claim 7, wherein the third electronic component is mounted immediately over at least one of the inlet holes, such that air entering the interior space passes directly through the third electronic component.

10. The fan motor controller assembly of claim 7, wherein the third electronic component is an auto-transformer rectifier unit.

11. The fan motor controller assembly of claim 6, wherein the first electronic component is an insulated gate bipolar transistor module.

12. The fan motor controller assembly of claim 6, wherein the second electronic component is one of an inductor and a transformer.

13. The fan motor controller assembly of claim 6, wherein the second electronic component is mounted immediately over at least one of the bleed holes, such that air exiting the interior space via the bleed holes passes directly through the second electronic component.

14. The fan motor controller assembly of claim 6, wherein the second electronic component is attached to a platform through which at least one of the bleed holes extends, such that air exiting the interior space via the bleed holes passes through the platform to cool the second electronic component.

15. The fan motor controller assembly of claim 6, wherein the first electronic component is mounted directly radially outward of the stator vanes.

16. A method for cooling electronic components within an interior space formed between an electronics housing and a fan duct carrying rotor blades and stator vanes, the method comprising:

drawing air into the interior space from the fan duct through an inlet hole, and through a first electronic component mounted on the fan duct and positioned immediately adjacent to the inlet hole;

expelling air from the interior space into a surrounding environment through a bleed hole, and through a second electronic component mounted on electronics housing and positioned immediately adjacent to the bleed hole; and conductively cooling a third electronic component mounted on the fan duct and positioned immediately radially outward of the stator vanes, by utilizing the stator vanes as cooling fins to dissipate heat into a main airflow stream through the fan duct.

17. The method of claim 16, wherein air which enters the interior space via the inlet hole and leaves via the bleed hole forms a cooling airflow which dissipates heat from a fourth electronic component mounted within the interior space, but not over the inlet hole or the bleed hole.

18. The method of claim 17, wherein additional inlet holes and additional bleed holes not adjacent to electronic components contribute to the cooling airflow.

19. The method of claim 16, wherein the first electronic component is an auto-transformer rectifier unit.

20. The method of claim 16, wherein the second electronic component is an insulated gate bipolar transistor module, and the third electronic component is one of an inductor or a transformer.

* * * * *